(12) United States Patent
Haga

(10) Patent No.: US 8,063,299 B2
(45) Date of Patent: Nov. 22, 2011

(54) SOLAR BATTERY MODULE

(75) Inventor: Takahiro Haga, Izumisano (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 1176 days.

(21) Appl. No.: 10/875,498

(22) Filed: Jun. 25, 2004

(65) Prior Publication Data

US 2005/0016580 A1 Jan. 27, 2005

(30) Foreign Application Priority Data

Jun. 27, 2003 (JP) ................. 2003-185929

(51) Int. Cl.
H01L 31/0232 (2006.01)
H01L 31/052 (2006.01)

(52) U.S. Cl. ........ 136/246; 136/251; 136/259; 136/256; 136/257

(58) Field of Classification Search .......... 136/251, 136/256, 433, 466, 244; 438/72, 609; 427/204, 427/205

See application file for complete search history.

(56) References Cited

U.S. PATENT DOCUMENTS

| | | | | |
|---|---|---|---|---|
| 4,287,382 A | * | 9/1981 | French | 136/244 |
| 4,311,869 A | * | 1/1982 | Kurth et al. | 136/246 |
| 4,443,652 A | * | 4/1984 | Izu et al. | 136/251 |
| 4,487,989 A | * | 12/1984 | Wakefield et al. | 136/256 |
| 4,631,351 A | * | 12/1986 | Tawada et al. | 136/244 |
| 4,697,041 A | * | 9/1987 | Okaniwa et al. | 136/244 |
| 5,279,686 A | * | 1/1994 | Nishida | 136/258 |
| 5,468,988 A | * | 11/1995 | Glatfelter et al. | 257/431 |
| 5,726,006 A | * | 3/1998 | Gourlaouen et al. | 430/567 |
| 6,008,449 A | * | 12/1999 | Cole | 136/246 |
| 6,479,744 B1 | * | 11/2002 | Tsuzuki et al. | 136/256 |
| 6,515,217 B1 | * | 2/2003 | Aylaian | 136/246 |
| 6,613,603 B1 | * | 9/2003 | Sano | 438/72 |
| 2001/0023702 A1 | * | 9/2001 | Nakagawa et al. | 136/244 |
| 2002/0185170 A1 | | 12/2002 | Shiotsuka et al. | |
| 2004/0154658 A1 | * | 8/2004 | Tanaka et al. | 136/256 |

FOREIGN PATENT DOCUMENTS

| | | |
|---|---|---|
| JP | 57-12567 A | 1/1982 |
| JP | 61-226972 A | 10/1986 |
| JP | 61226972 A | 10/1986 |
| JP | 01308178 * | 12/1989 |
| JP | 09-260696 A | 10/1997 |

(Continued)

OTHER PUBLICATIONS

European Search Report dated Jul. 12, 2007, issued in corresponding European Patent Application No. 04 25 3713.

(Continued)

Primary Examiner — Keith D Hendricks
Assistant Examiner — Bach T Dinh
(74) Attorney, Agent, or Firm — Westerman, Hattori, Daniels & Adrian, LLP

(57) ABSTRACT

It is an object of the present invention to easily and inexpensively provide a structure of effectively utilizing a light incident on an invalid area of a solar cell. Moreover, it is another object to improve output characteristics of the solar cell by effectively utilizing the light. The gist of the present invention resides in a solar battery module in which plate-like solar cells are held between a light penetrable sheet member on a light receiving surface side and a sheet member on a back surface side, and internal apertures are filled with a sealing resin, wherein a light diffusion section for diffusely reflecting a light or a light diffusion section of a white color is arranged in an invalid region of each solar cell.

12 Claims, 4 Drawing Sheets

FOREIGN PATENT DOCUMENTS

| | | |
|---|---|---|
| JP | 10-93117 | 4/1998 |
| JP | 11-298029 | 10/1999 |
| JP | 11298029 A | 10/1999 |
| JP | 11-307791 | 11/1999 |
| JP | 11-307795 | 11/1999 |
| JP | 2003-37281 A | 2/2003 |

OTHER PUBLICATIONS

Tachibana, S. et al., "*Concentrater Single Crystal PV Module*", Sharp Gihou (Sharp Corporation Technical Report), Sharp Corporation, Nara, Japan, No. 70, (Apr. 1998), pp. 69-70—English language translation of marked-up portion is enclosed.

Office Action dated Dec. 7, 2007 issued in corresponding Chinese Application No. 2004-100453224.

Japanese Office Action dated Dec. 22, 2008 issued in corresponding Japanese Patent Application No. 2003-185929.

Japanese Office Action dated Apr. 7, 2009, issued in corresponding Japanese patent application No. 2003-185929.

R. Preu, et al., "Optimisation of Cell Interconnectors for PV Module Performance Enhancement"; 1997.

\* cited by examiner

SOLAR BATTERY MODULE

BACKGROUND OF THE INVENTION

The present invention relates to a solar battery module.

Japanese Patent Application Laid-Open No. 10-93117 discloses a structure regarding a conventional solar cell. In a collecting electrode on the solar cell, a side surface is formed as a tilting surface to reflect an incident light toward a light receiving surface. Accordingly, the collecting electrode is arranged in an invalid region on the solar cell, and a light incident on this invalid region is put to effective use.

In the conventional solar cell, inexpensive formation of a collecting electrode which has a tilting surface has been difficult in terms of a manufacturing process and used materials.

SUMMARY OF THE INVENTION

The present invention has been made to solve the foregoing problem, and it is an object of the invention to easily and inexpensively provide a structure of effectively utilizing a light incident on an invalid area of a solar cell.

The present invention is directed to a solar battery module in which plate-like solar cells are held between a light penetrable sheet member on a light receiving surface side and a sheet member on a back surface side, and internal apertures are filled with a sealing resin, wherein a light diffusion section for diffusely reflecting a light or a light diffusion section of a white color is arranged in an invalid region of each solar cell.

DETAILED DESCRIPTION OF THE PREFERRED EMBODIMENT

Figure 1:
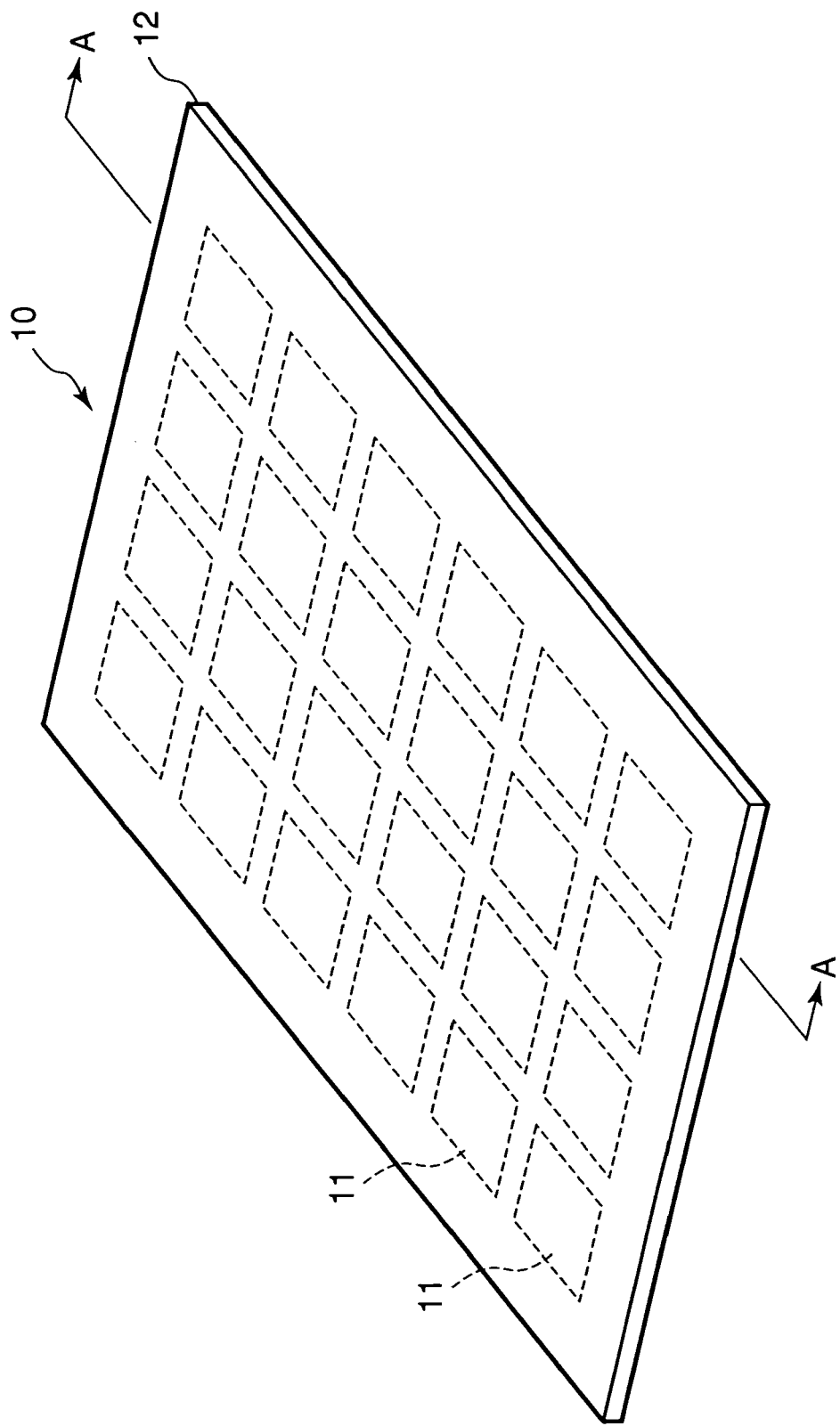
FIG. 1 is a perspective view showing an embodiment of the present invention.
Figure 2:
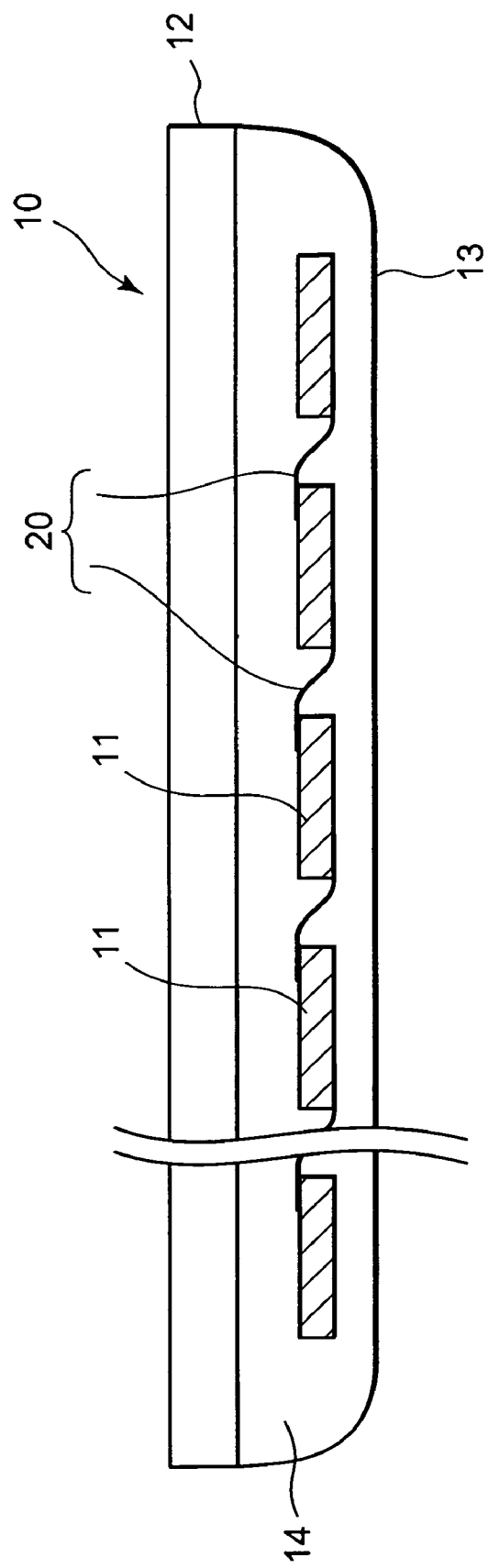
FIG. 2 is a sectional view cut along the line A-A of FIG. 1.

Next, an embodiment of the present invention will be described in detail with reference to FIGS. 1 to 4. Among the drawings, FIG. 1 is a perspective view of a solar battery module, and FIG. 2 is a main portion sectional view cut along the line A-A of FIG. 1. In FIG. 1, the solar battery module 10 has a roughly rectangular plate form, and comprises a light penetrable sheet member 12 such as glass on a light receiving surface side, and a sheet member 13 such as a fluororesin or PET resin film (thickness of about 40 to 50 μm) on a back surface side.

A plurality of plate-like solar cells 11 rectangular in shape when seen from a plane are arranged at intervals in an adjacent and fixed state by a light penetrable sealing resin 14 fully supplied between the light penetrable sheet member 12 and the sheet member 13.

Regarding a method and a structure for sealing the plurality of solar cells 11, the sheet sealing resin 14 is arranged among the light penetrable sheet member 12, the solar cells 11, and the sheet member 13 before pressure vacuum heating of ethylene-vinylacetate (EVA) or the like. In this arranged state, the sealing resin 14 is subjected to pressure vacuum heating from front and back surfaces of a solar battery module 10 to be softened. Then, the sealing resin 14 fills internal apertures to complete a structure of FIG. 2.

As the solar cell 11, a silicon single-crystal or polycrystal solar cell can be used. Incidentally, according to the embodiment, for the solar cell 11, a structure of a double-surface power generation type capable of generating power on front and back surfaces is used, which comprises a transparent conductive film, a p-type amorphous semiconductor film, an i-type amorphous semiconductor film, an n-type crystal semiconductor substrate, an i-type amorphous semiconductor film, an n-type amorphous semiconductor film, and a transparent conductive film from the front surface side.

In such a solar cell 11, a laminated structure of at least the transparent conductive film, the p-type amorphous semiconductor film and the i-type amorphous semiconductor film on the front surface side is disposed inwardly as much as a certain distance along a full outer periphery of the n-type crystal semiconductor substrate. As just described, an area of the laminated structure on the light receiving surface side is smaller in order to prevent an inconvenience that the laminated structure on the front surface side, and a laminated structure of the i-type amorphous semiconductor film, the n-type amorphous semiconductor film and the transparent conductive film on the back surface side get into a side of the n-type crystal semiconductor substrate, adhere thereto, and come in contact with each other to become a short circuit state, during a manufacturing process. Therefore, an outer peripheral invalid region 1 (see FIG. 3) which does not contribute to power generation is positioned on the outer periphery on the light receiving surface side of the solar cell 11.

Additionally, a collecting electrode 16 made of a silver paste or the like is arranged on the light receiving surface and the back surface side of the solar cell 11. A plan view seen from the back surface side of the solar cell 11 is similar to the plan view (=FIG. 3) seen from the front surface side, and hence, it is not shown.

As shown, the collecting electrode 16 comprises two bus electrode sections 15 (width of about 2 mm) extending in parallel with sides, and a plurality of finger electrode sections 12 (width of about 50 μm, interval of about 2 to 3 mm) extending orthogonally to the bus electrode sections 15. The invalid region that makes no contribution to power generation is positioned below such a collecting electrode 16.

In FIG. 1, the adjacent solar cells 11 are electrically connected by a connection member 20 prepared by dipping solder in metal foil, e.g., copper foil. Specifically, one end side of the connection member 20 is connected through a solder layer (not shown) to the bus electrode section 15 of the collecting electrode 16 of the solar cell 11. The other end side of the connection member is connected through the solder layer (not shown) to the bus electrode section of the collecting electrode on the back surface side of the other interconnected solar cell 11.

Figure 3:
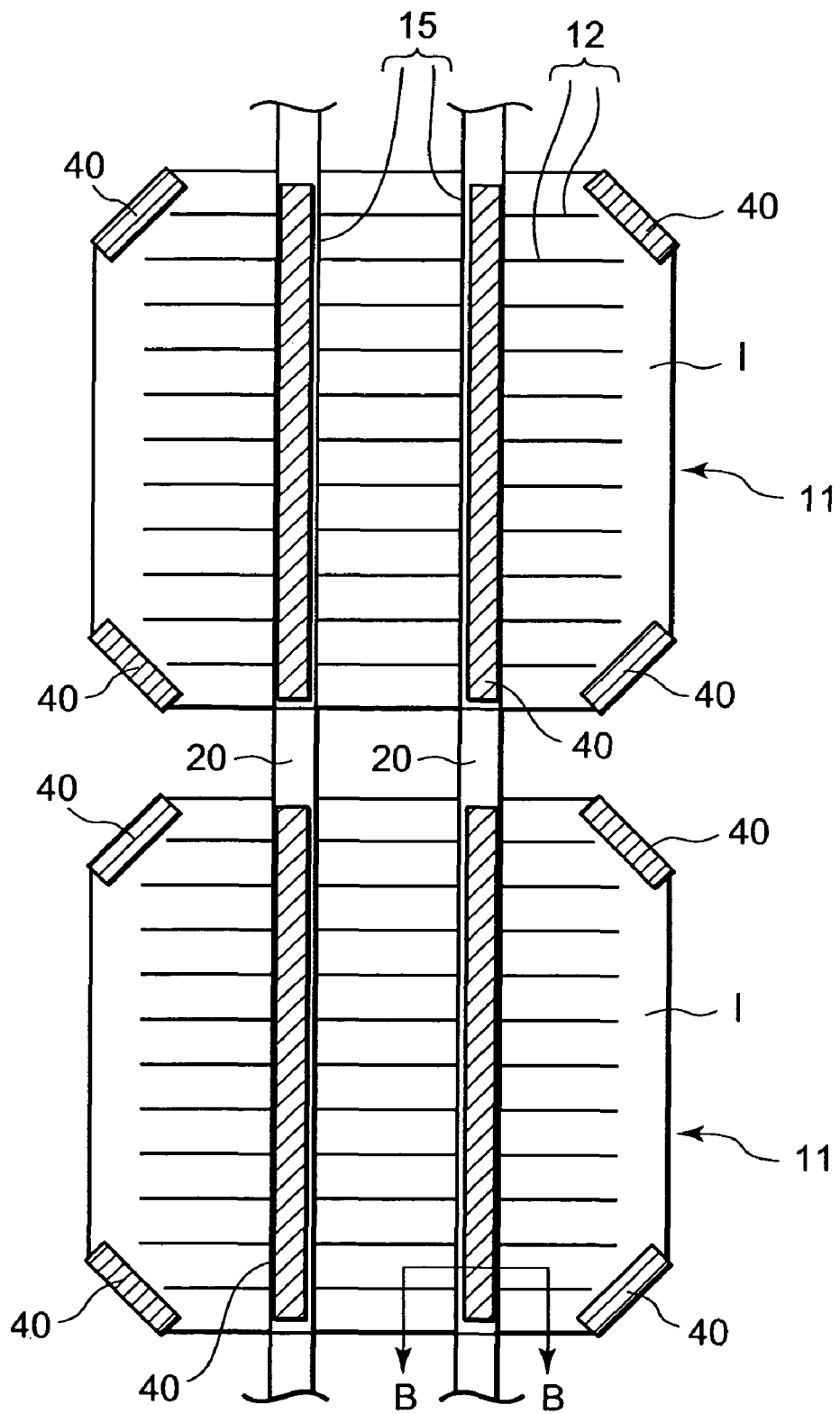
FIG. 3 is a main portion plan view showing electrically connected solar cells of the invention.

Next, description will be made of a light diffusion section 40 which is a feature of the embodiment. As shown in FIG. 3, the light diffusion section 40 is installed in the outer peripheral invalid region 1 positioned on the outer periphery of the solar cell 11, specifically in the invalid region 1 near a cut-off corner. Additionally, the light suffusion section 40 is installed in the connection member 20 connected to the bus electrode section 15 of the collecting electrode 16 located in the invalid region.

Figure 4:
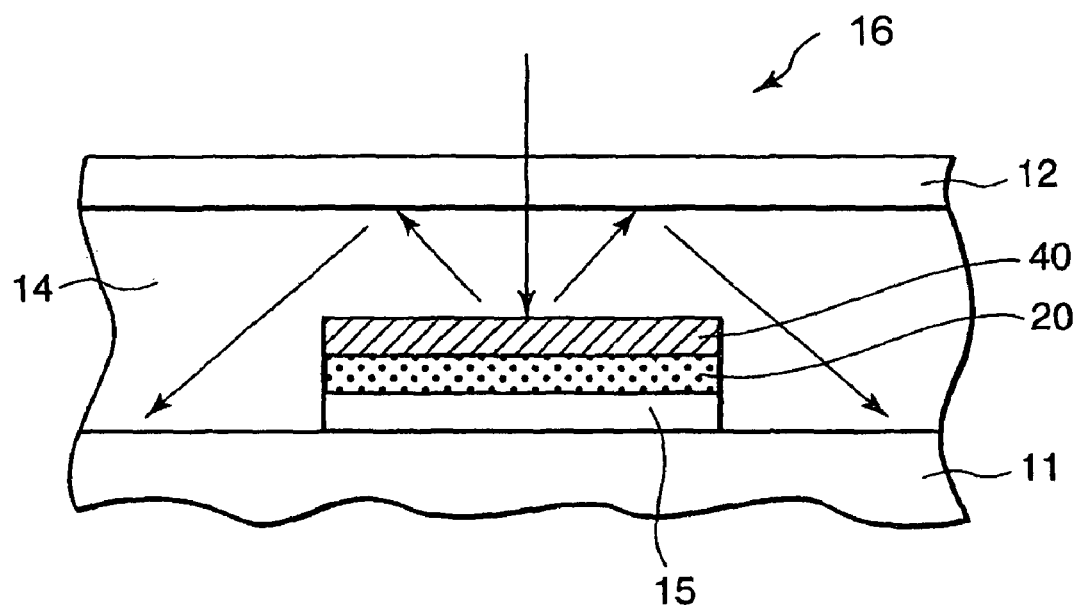
FIG. 4 is a sectional view of the embodiment of the invention equivalent to a section cut along the line B-B of FIG. 3.

For the light diffusion section 40, a white insulating resin sheet of polyethylene terephthalate (PEP), polyvinyl fluoride (PVF) or the like is cut to match a size of the invalid region, and then used. In such an insulating resin sheet, as a white color, the light receiving surface side is made rugged to diffuse and reflect an incident light. Incidentally, the light diffusion section 40 may be a white sheet of no ruggedness. The light diffusion section 40 may be made of a rugged-surface material of a high reflectance, e.g., an aluminum material or the like. If the light diffusion section 40 made of such a metal material is arranged in the outer peripheral invalid region 1, an insulating material is preferably disposed between the solar cell 11 and the light diffusion section 40 in order to prevent electric conduction with the solar cell 11. As shown in FIG. 4, a reflected light (main optical path is indicated by an arrow in FIG. 4) is reflected on interfaces between the light penetrable sheet member 12 on the light receiving surface side and the sealing resin 14, and between the light penetrable sheet member 12 and air, and is incident on the light receiving surface of the solar cell 11, whereby output characteristics of the solar cell 11 and the solar battery module 10 are improved. Moreover, in the light diffusion section 40 arranged in the outer peripheral invalid region 1, an incident light is similarly diffused and reflected to improve output characteristics.

In place of the aforementioned light diffusion section 40, the light receiving surface of the connection member 20 made of the metal foil may be made rugged to be used as a light diffusion section.

The solar battery module of the embodiment can be fixed to a roof, a slope, an outer wall of a building or the like by disposing an outer frame made of a metal material such as aluminum on an outer periphery thereof. Additionally, the solar battery module can be fixed to the slope or the outer wall of the building by using an adhesive on the back surface side of the solar cell 11.

According to the present invention, since the light diffusion section is arranged in the invalid region of the solar cell, the reflected light is reflected again on the interfaces between the light penetrable sheet member on the light receiving surface side and the sealing resin, and between the light penetrable sheet member on the light receiving surface side and outside air, or the like, and is incident on the light receiving surface of the solar cell. As a result, it is possible to improve characteristics and to effectively use the incident light in the invalid region.

What is claimed is:

1. A solar battery module comprising:
    a light penetrable sheet member;
    a sheet member;
    plate-like solar cells held between said light penetrable sheet member on a light receiving surface side and said sheet member on a back surface side with internal apertures therebetween filled with a sealing resin;
    wherein said plate like solar cells have a generally rectangular shape, except that each of its four corners is cut-off at an approximately 45° angle; and
    a plurality of light diffusion sections diffusely reflecting light and arranged along each cut-off corner on an invalid region of each solar cell, wherein
    the light diffusion sections are arranged on the invalid region positioned on the light receiving surface side of the solar cell, and
    the light diffusion sections diffuse and reflect light to the light penetrable sheet member side,
    wherein a connection member for electrically connecting the adjacent solar cells is arranged on the invalid region of said solar cells, and the light diffusion section is arranged on a light receiving surface side of the connection member;
    wherein said light diffusion sections along with said light penetrable sheet member are designed to reflect light to a solar cell which is immediately adjacent to said light diffusion sections;
    wherein said connection member is located on and in contact with a bus electrode and
    wherein said connection member runs parallel, directly above said bus electrode.

2. The solar battery module of claim 1, wherein the light penetrable sheet member is glass.

3. The solar battery module of claim 1, wherein the sheet member is a fluororesin resin film.

4. The solar battery module of claim 1, wherein the sheet member is a PET resin film.

5. The solar battery module of claim 1, wherein the solar cells are silicon single-crystal cells.

6. The solar battery module of claim 1, wherein the solar cells are polycrystal solar cells.

7. The solar battery module of claim 1, wherein the light diffusion section is a white color.

8. The solar battery module of claim 1, further comprising a collecting electrode arranged on the light receiving surface and the back surface side.

9. The solar battery module of claim 8, wherein the collecting electrode is comprised of a silver paste.

10. The solar battery module of claim 8, wherein the collecting electrode includes:
    a plurality of bus electrode sections extending in parallel; and
    a plurality of finger electrode sections extending orthogonally to the plurality of bus electrode sections.

11. The solar battery module of claim 1, wherein said connection member is comprised of solder with a metal foil coating, and is adjacent to the solar cells.

12. A solar battery module comprising:
    a transparent sheet member;
    a sheet member;
    plate-like solar cells located between said transparent sheet member on a light receiving surface side and said sheet member on a back surface side with a sealing resin fully supplied between the transparent sheet member and the sheet member;
    wherein said plate like solar cells have a generally rectangular shape, except that each of its four corners is cut-off at an approximately 45° angle; and
    a plurality of light diffusion sections arranged along each cut-off corner on an outer peripheral invalid region of one of said solar cells, and said plurality of light diffusion sections diffusely reflecting light, wherein
    the light diffusion sections are arranged on the invalid region positioned on the light receiving surface side of the solar cell; and
    the light diffusion sections diffuse and reflect light to the transparent sheet member side,
    wherein a connection member for electrically connecting the adjacent solar cells is arranged on the invalid region of said solar cells, and the light diffusion section is arranged on a light receiving surface side of the connection member;
    wherein said light diffusion sections along with said transparent sheet member are designed to reflect light to a solar cell which is immediately adjacent to said light diffusion sections;
    wherein said connection member is located on and in contact with a bus electrode and
    wherein said connection member runs parallel, directly above said bus electrode.

* * * * *